(12) United States Patent
Lehmann et al.

(10) Patent No.: US 7,403,432 B2
(45) Date of Patent: Jul. 22, 2008

(54) DIFFERENTIAL READ-OUT CIRCUIT FOR FUSE MEMORY CELLS

(75) Inventors: Gunther Lehmann, Holzkirchen (DE); Vianney Choserot, Antibes (FR); Jean-Yves Larguier, Xi'an (CN)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/358,374

(22) Filed: Feb. 21, 2006

(65) Prior Publication Data

US 2006/0203585 A1 Sep. 14, 2006

(30) Foreign Application Priority Data

Feb. 28, 2005 (DE) .................. 10 2005 009 050

(51) Int. Cl.
*G11C 7/10* (2006.01)
(52) U.S. Cl. ............. 365/189.05; 365/154; 365/225.7; 327/525
(58) Field of Classification Search ................ 365/202, 365/189.05, 230.06, 154, 156; 327/525, 327/563
See application file for complete search history.

(56) References Cited

U.S. PATENT DOCUMENTS

| | | | |
|---|---|---|---|
| 4,168,537 A * | 9/1979 | Uchida | 365/154 |
| 5,414,671 A * | 5/1995 | Fukumoto | 365/228 |
| 6,020,777 A | 2/2000 | Bracchitta et al. | |
| 6,108,261 A | 8/2000 | Kim et al. | |
| 6,121,820 A | 9/2000 | Shishikura | |
| 6,201,733 B1 * | 3/2001 | Hiraki et al. | 365/185.08 |
| 6,201,750 B1 | 3/2001 | Busch et al. | |
| 6,373,771 B1 | 4/2002 | Fifield et al. | |
| 6,384,664 B1 | 5/2002 | Hellums et al. | |
| 6,498,526 B2 * | 12/2002 | Lim et al. | 327/525 |
| 2002/0008544 A1 | 1/2002 | Lim et al. | |

FOREIGN PATENT DOCUMENTS

EP 0 511 560 A2 11/1992

OTHER PUBLICATIONS

"Halbleiter-Schaltungstechnik" ("Semiconductor Circuitry") U. Tietze and Ch. Schenk, Springer Verlag, Berlin, 12th Edition, 2002, p. 639.

* cited by examiner

*Primary Examiner*—Gene N. Auduong
(74) *Attorney, Agent, or Firm*—Eschweiler & Associates, LLC

(57) ABSTRACT

A read-out circuit is disclosed, where the circuit reads information out of a memory unit comprising two non-volatile memory cells. The cells have different programming states, and the memory information of the memory unit is given by the programming states of the two memory cells. The read-out circuit has a volatile signal memory, the inputs of which are connected to the read outputs of the memory cells.

18 Claims, 4 Drawing Sheets

DIFFERENTIAL READ-OUT CIRCUIT FOR FUSE MEMORY CELLS

REFERENCE TO RELATED APPLICATIONS

This application claims the benefit of the priority date of German application DE 10 2005 009 050.8, filed on Feb. 28, 2005, the contents of which are herein incorporated by reference in their entirety.

FIELD OF THE INVENTION

One or more aspects and/or embodiments of the present invention relate to a read-out circuit for non-volatile memory elements and in particular for fuse memory cells.

BACKGROUND OF THE INVENTION

It will be appreciated that fuse memory cells are increasingly being used in integrated circuits, in particular in semiconductor memories, such as DRAMs, for example. A fuse memory cell essentially comprises a metal-metal connection having a low contact resistance, which can be interrupted after the actual production process, whereby the contact resistance of the fuse memory cell is increased. The fuse memory cell can thus assume the programming states "conducting" and "non-conducting", that is to say that it represents either a logic 1 or a logic 0.

The metal-metal connection of a fuse memory cell is interrupted as required either by the application of a current or by the action of a laser beam. Depending on the method by means of which their metal-metal connections can be interrupted, fuse memory cells are referred to as electrical fuse memory cells or as laser fuse memory cells.

Furthermore, so-called antifuse memory cells also exist, in the case of which an electrical connection is not interrupted, rather such a connection is provided after the actual production process for programming purposes. No distinction is made hereinafter between fuse and antifuse memory cells. Instead, the term "fuse memory cells" is understood to mean both types of fuse memory cells.

In the German-language specialist literature the terms "Schmelzbrücken" ["fusible links"], "auftrennbare Schmelzbrücken" ["interruptible fusible links"] or "Sicherungen" ["fuses"] are occasionally used for fuse memory cells. However, even in the German-language specialist literature, the term "Fuse" [fuse"] is significantly more common. Therefore, the text hereinafter will refer to fuse memory cells.

Conventional electrical fuse memory cells have a resistance of 7 kΩ in the case of an interrupted fuse connection and a resistance of 300Ω in the case of an intact fuse connection. The high resistance value of a blown fuse memory cell is obtained by means of a high fusing voltage that is present at the fuse memory cell during the interruption operation. For a high fusing voltage to be applied to the fuse memory cell, the oxide substrate on which the fuse memory cell is situated must have a certain minimum thickness. However, such an oxide thickness is generally not required by the remaining components arranged on the same substrate. Accordingly, high additional costs are associated with a high resistance value of a blown fuse memory cell.

Conventional read-out circuits by means of which the programming state of a fuse memory cell is read out compare the resistance of the fuse memory cell with the resistance of the source-drain path of a MOS transistor arranged in the measurement path. The measured resistance of the fuse memory cell also depends on fluctuations during the production of the transistor.

A further disadvantage of conventional read-out circuits for fuse memory cells is static currents that flow through the fuse connection during the reading of a blown fuse memory cell. In addition to the increased current consumption, these currents also pose a safety problem for the associated circuit.

SUMMARY OF THE INVENTION

The following presents a simplified summary in order to provide a basic understanding of one or more aspects and/or embodiments of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

One or more aspects and/or embodiments of the present invention pertain to a read-out circuit for non-volatile memory elements and in particular for fuse memory cells which has a higher read-out accuracy than conventional read-out circuits serving the same purpose. Additionally, a memory arrangement comprising the read-out circuit is also provided.

The read-out circuit disclosed herein serves to read out memory information stored in a memory unit. The memory unit comprises two non-volatile memory cells having mutually different programming states. The memory information stored in the memory unit results from the choice of the programming states of the two memory cells.

In order to read out memory information stored in the memory unit, the read-out circuit comprises a volatile signal memory. The volatile signal memory has two inputs and at least one output. The two inputs of the volatile signal memory are connected to a respective read output of the two memory cells at least during the read-out operation. The signal memory compares the two programming states of the memory cells and determines the memory information of the memory unit therefrom. The memory information of the memory unit can be tapped off at the at least one output of the signal memory.

A differential read-out as described herein allows memory information stored in a memory unit to be read out significantly more accurately than would be possible with a non-differential read-out circuit. Additionally, mismatches caused by production fluctuations are mitigated by circuit symmetry provided herein. Furthermore, fluctuations of the supply voltage (e.g., "ground bounce"), due to a differential construction, are mitigated so as to be less influential on the read-out behaviour of the read-out circuit as compared to non-differential read-out circuits. This enables a parallel read-out from a multiplicity of memory units.

In one example, two non-volatile memory cells can have different programming states by having mutually complementary programming states. The memory information stored in the memory unit is then given by the optional assignment of the programming states to the memory cells. Consequently, the memory information of the memory unit can be determined by a comparison of the two programming states.

Alternatively, one of the two memory cells may be fixedly programmed to have a fixed reference programming state. The memory unit is then programmed by programming the second memory cell (e.g., between two programming states). A comparison of the programming states of the two memory cells makes it possible to ascertain the programming state of the second memory cell has. The programming state of the memory unit is then simultaneously provided.

The non-volatile memory cells may be realized as 1-bit memory cells in the case of complementary programming states. Since the memory cells are programmed complementarily with respect to one another, the bit "0" is stored in one of the two 1-bit memory cells, while the other 1-bit memory cell contains the bit "1". The memory information of the memory unit comprising the two 1-bit memory cells is defined by the selection of which bit is stored in which 1-bit memory cell.

Furthermore, the non-volatile memory cells may be realized by means of fuse memory cells. In order to generate complementary, that is to say opposite, programming states of the fuse memory cells, the fuse connection of one of the two fuse memory cells has to be blown, while the other fuse memory cell remains intact. The selection of which of the two fuse connections is interrupted determines the memory information of the memory unit formed from the two fuse memory cells. If the second programming possibility is chosen, the first fuse memory cell has a fixed reference resistance value. The second fuse memory cell has, in the intact state, a resistance value which differs from the reference resistance value and is typically less than the latter. In the blown state, the resistance value of the second fuse memory cell is generally greater than the reference resistance value.

Since the read-out circuit has a high read-out accuracy, a resistance value of an interrupted fuse connection in the region of 1 kΩ suffices to distinguish between the interrupted and the intact fuse memory cell. The high resolution capability of the read-out circuit consequently makes it possible to blow the fuse memory cells with a lower fusing voltage than conventional techniques. This in turn makes it superfluous to use thick oxide substrates that have conventionally been used due to high fusing voltages.

It will be appreciated that the maximum current occurring during the read-out of the programming states of the fuse memory cells does not depend on the memory information stored in the fuse memory cells due to the differential arrangement of the read-out circuit described herein.

In one example, volatile signal memory is a latch signal memory realized by positive feedback. A differential latch signal memory prevents a static current flow after a read-out operation. Differential latch signal memory also provides for faster read-out behaviour over conventional read-out circuits.

The latch signal memory may contain two inverters where the output of one inverter may be connected to the input of the other inverter.

The two inverters are constructed from two series-connected transistors. Each of these two series circuits is connected to the read output of one of the non-volatile memory cells at least during the read-out operation. The terminals of the inverters which are connected to the read outputs of the memory cells may also be the terminals which are normally provided for connecting a supply voltage potential.

The series-connected transistors of the inverters are respectively realized by NMOS and PMOS transistors. The read outputs of the memory cells are connected to the source-drain path of one of the two transistor series circuits.

The read outputs of the memory cells are connected to the source terminal of the NMOS transistor of the respective inverter at least during the read-out of the programming states of the memory cells. The source terminals of the NMOS transistors consequently represent the differential inputs of the latch signal memory. The gate terminals of the transistors of one of the two inverters normally form the input of a latch signal memory.

A supply voltage potential is applied to the source terminals of the PMOS transistors.

Furthermore, the supply voltage potential can be applied to the connecting nodes—which connect two transistors of an inverter to one another—via at least one first switch.

The at least one first switch is designed in such a way that it isolates the connecting nodes between the respective two transistors of an inverter from the supply voltage potential during the read-out of the memory information of the memory unit.

The supply voltage potential may likewise be applied to the inputs of the signal memory. At least one second switch is provided for this purpose.

The at least one second switch is designed in such a way that it isolates the inputs of the signal memory from the supply voltage potential during the read-out of the memory information of the memory unit.

Third switches may be provided between the read outputs of the memory cells and the inputs of the signal memory. The third switches are configured in such a way that they connect the inputs of the signal memory to the read outputs of the memory cells during the read-out of the memory information stored in the memory unit.

The metal-metal connections of the fuse memory cells may be electrically interruptible fuse connections.

In one example, a memory arrangement comprises a memory unit and a read-out circuit. The memory unit comprises two non-volatile memory cells having different programming states. The memory information stored in the memory unit is given by the programming states of the two memory cells. The read-out circuit is connected to the memory unit to read out memory information.

BRIEF DESCRIPTION OF THE DRAWINGS

The invention is explained in more detail below wherein reference is made to the following drawings.

DETAILED DESCRIPTION OF THE INVENTION

Figure 1:
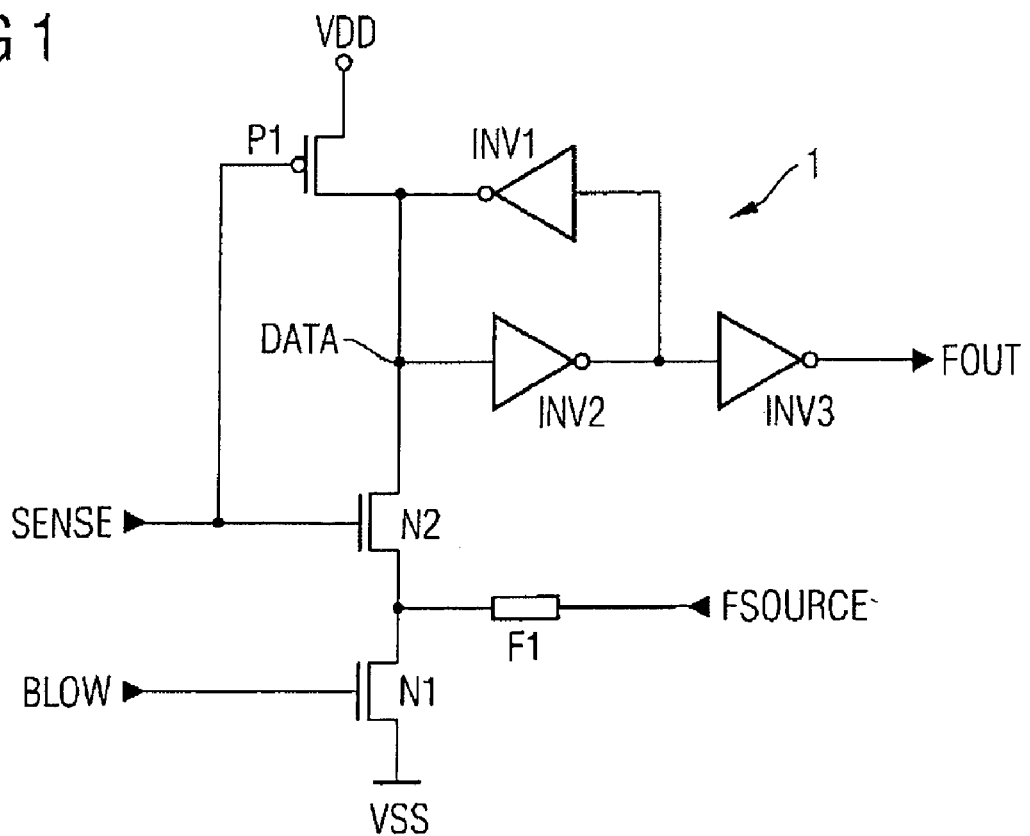
FIG. 1 is a schematic block diagram illustrating a read-out circuit for conventionally reading out the programming state of an electrical fuse memory cell.

One or more aspects or embodiments of the present invention will now be described with reference to the drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding. It will be appreciated that variations of the illustrated systems and methods apart from those illustrated and described herein may exist and that such variations are deemed as falling within the scope of the present invention and the appended claims.

Turning to FIG. 1, a schematic circuit diagram illustrates a conventional read-out circuit 1 for reading out the programming state of an electrical fuse memory cell F1.

The fuse memory cell F1 has two terminals. One terminal of the fuse memory cell F1 forms the input designated by FSOURCE in FIG. 1. The other terminal of the fuse memory cell F1 can be connected to a ground VSS via a transistor N1. This terminal furthermore represents the read output of the fuse memory cell F1. In order to read out the programming state of the fuse memory cell F1, the read output is connected to the source terminal of a transistor N2. The drain terminal of the transistor N2 is connected to a node DATA, which forms the input of a latch signal memory. The latch signal memory essentially comprises two inverters INV1 and INV2, the output of the inverter INV1 being connected to the input of the inverter INV2 and the output of the inverter INV2 being connected to the input of the inverter INV1. The output of the latch signal memory feeds a further inverter INV3 having an output FOUT.

A supply voltage potential VDD can furthermore be applied to the node DATA via a transistor P1. The gate terminals of the transistors N2 and P1 are connected to an input SENSE and the gate terminal of the transistor N1 is connected to an input BLOW.

The transistors N1 and N2 are MOS transistors having n-doped channels. The transistor P1 is a MOS transistor having a p-doped channel. In accordance with this mode of designation, hereinafter MOS transistors having an n-doped channel are identified by the letter "N" in their reference symbol, while MOS transistors having a p-doped channel are identified by the letter "P".

In order to interrupt a metal-metal connection of the fuse memory cell F1, a high voltage is applied to the input FSOURCE and the source-drain path of the transistor N1 is activated by means of a suitable voltage at the input BLOW. The current flow caused thereby through the fuse memory cell F1 brings about the desired blowing of the metal-metal connection.

Figure 2:
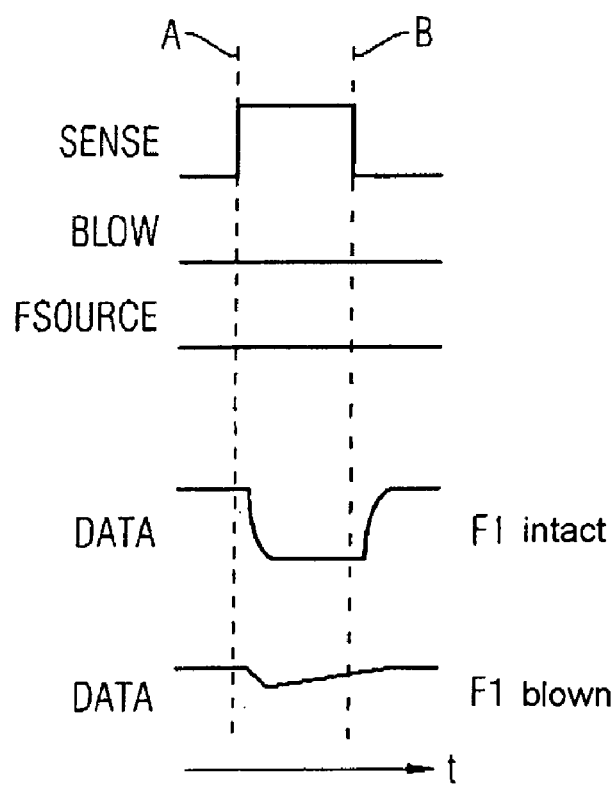
FIG. 2 is a schematic diagram illustrating the functioning of the read-out circuit depicted in FIG. 1.

The read-out method for determining the programming state of the fuse memory cell F1 is illustrated in FIG. 2. In FIG. 2, the potentials present at the inputs SENSE, BLOW and FSOURCE during the read-out method and also the potential arising at the node DATA in the case of an intact fuse memory cell F1 and in the case of a blown fuse memory cell F1 are plotted against the time t.

Two different potentials can be present at the inputs SENSE, BLOW and FSOURCE. These two potentials may be designated as "logic 0" and "logic 1" and may be realized for example by ground VSS and the supply voltage potential VDD.

In FIG. 2, the beginning of the read-out operation is identified by a dashed line A and the end of the read-out operation is identified by a dashed line B. The potential logic 0 is present at the inputs BLOW and FSOURCE throughout the read-out method. In this state, the source-drain path of the transistor N1 is turned off and the read output of the fuse memory cell F1 is isolated from ground VSS.

At the beginning of the read-out method, the input SENSE is switched from logic 0 to logic 1. As a result, the transistor N2 is turned on and the transistor P1 is turned off. Whereas before the changeover the node DATA was still connected to the supply voltage potential VDD, after the changeover the node DATA is connected to the read output of the fuse memory cell F1.

If the fuse memory cell F1 is intact and thus electrically conducting, the latch memory cell is discharged through the fuse memory cell F1 after the changeover of the potential at the input SENSE. Consequently, the potential at the node DATA falls to 0 after a certain time. In contrast, in the case of a blown fuse connection, the potential at the node DATA remains relatively constant after the changeover of the input SENSE. The potential at the node DATA can be read out at the output FOUT and the programming state of the fuse memory cell F1 can be deduced therefrom.

Figure 3:
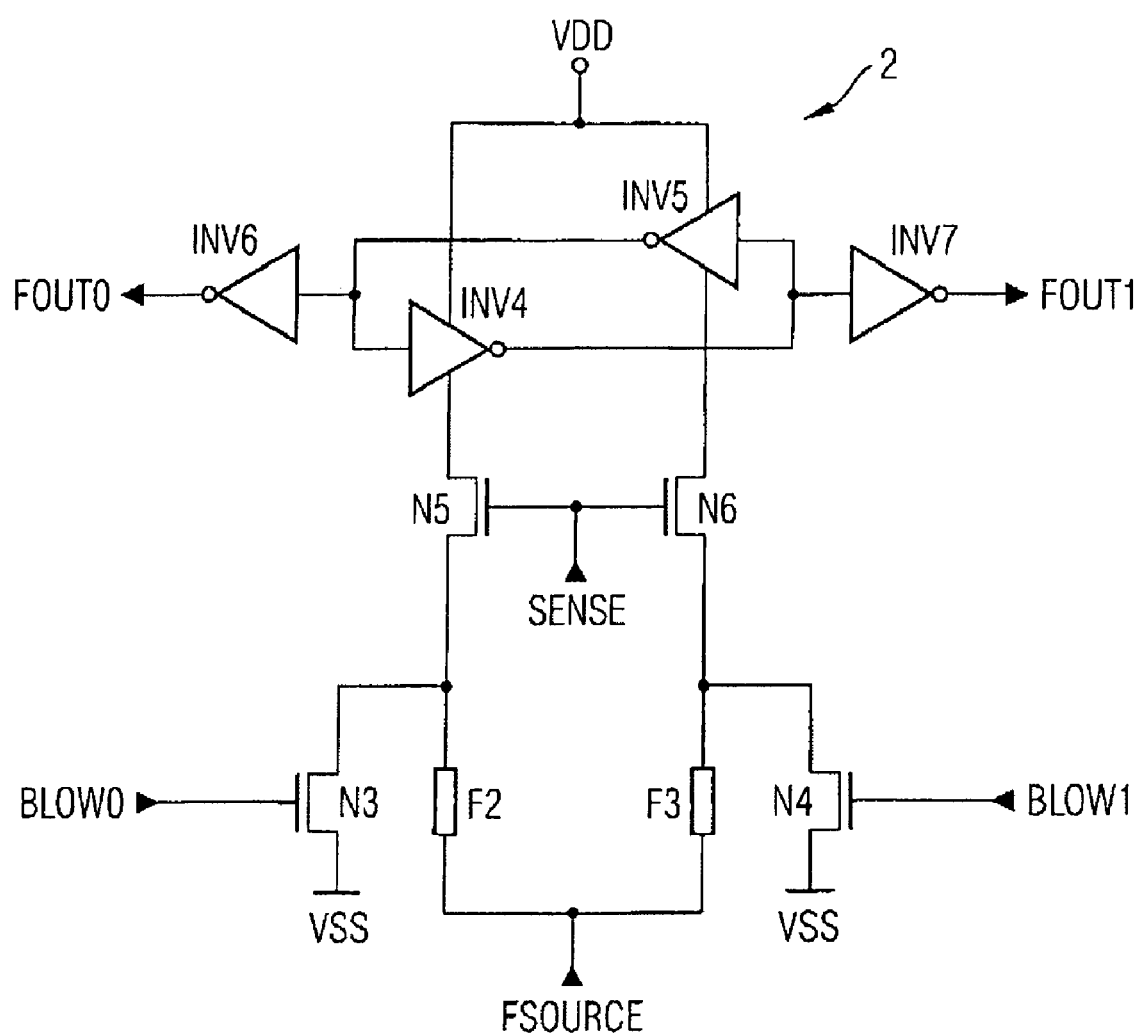
FIG. 3 is a schematic circuit diagram illustrating an exemplary read-out circuit for reading out the programming states of two electrical fuse memory cells according to one or more aspects and/or embodiments of the present invention.

Turning to FIG. 3, a schematic circuit diagram illustrates an exemplary read-out circuit 2 for reading out memory information stored in a memory unit according to one or more aspects and/or embodiments of the present invention. In the illustrated example, the memory unit comprises two electrical fuse memory cells F2 and F3. Respective terminals of the fuse memory cells F2 and F3 are connected to an input FSOURCE. The two other terminals of the fuse memory cells F2 and F3 can be connected to ground VSS via transistors N3 and N4. Furthermore, these terminals represent the read outputs of the fuse memory cells F2 and F3 and are in each case connected to the source terminal of one of transistors N5 and N6.

The read-out circuit 2 has a latch signal memory comprising two inverters INV4 and INV5. In contrast to conventional circuitry, however, the drain terminals of the transistors N5 and N6 are not connected to the input of one of the inverters INV4 and INV5. Rather, the drain terminal of the transistor N5 is connected to the input of the inverter INV4 which normally in the case of an inverter forms the terminal for a supply voltage potential, for example the ground terminal. The drain terminal of the transistor N6 is connected to the inverter INV5 in a corresponding manner.

To illustrate the terminals of an inverter to which the supply voltage is normally applied, reference is made to Figure 7.36 on page 639 of the book "Halbleiter-Schaltungstechnik" ["Semiconductor circuitry"] by U. Tietze and Ch. Schenk, published by Springer-Verlag, Berlin, 12th Edition, 2002.

The two other supply voltage terminals of the inverters INV4 and INV5 are connected to the supply voltage potential VDD. Furthermore, the output of the inverter INV5 is connected to the inputs of the inverter INV4 and of an inverter INV6. The output of the inverter INV4 is connected to the inputs of the inverter INV5 and of an inverter INV7. The outputs of the inverters INV6 and INV7 represent the outputs FOUT0 and FOUT1 of the read-out circuit 2.

Figure 4:
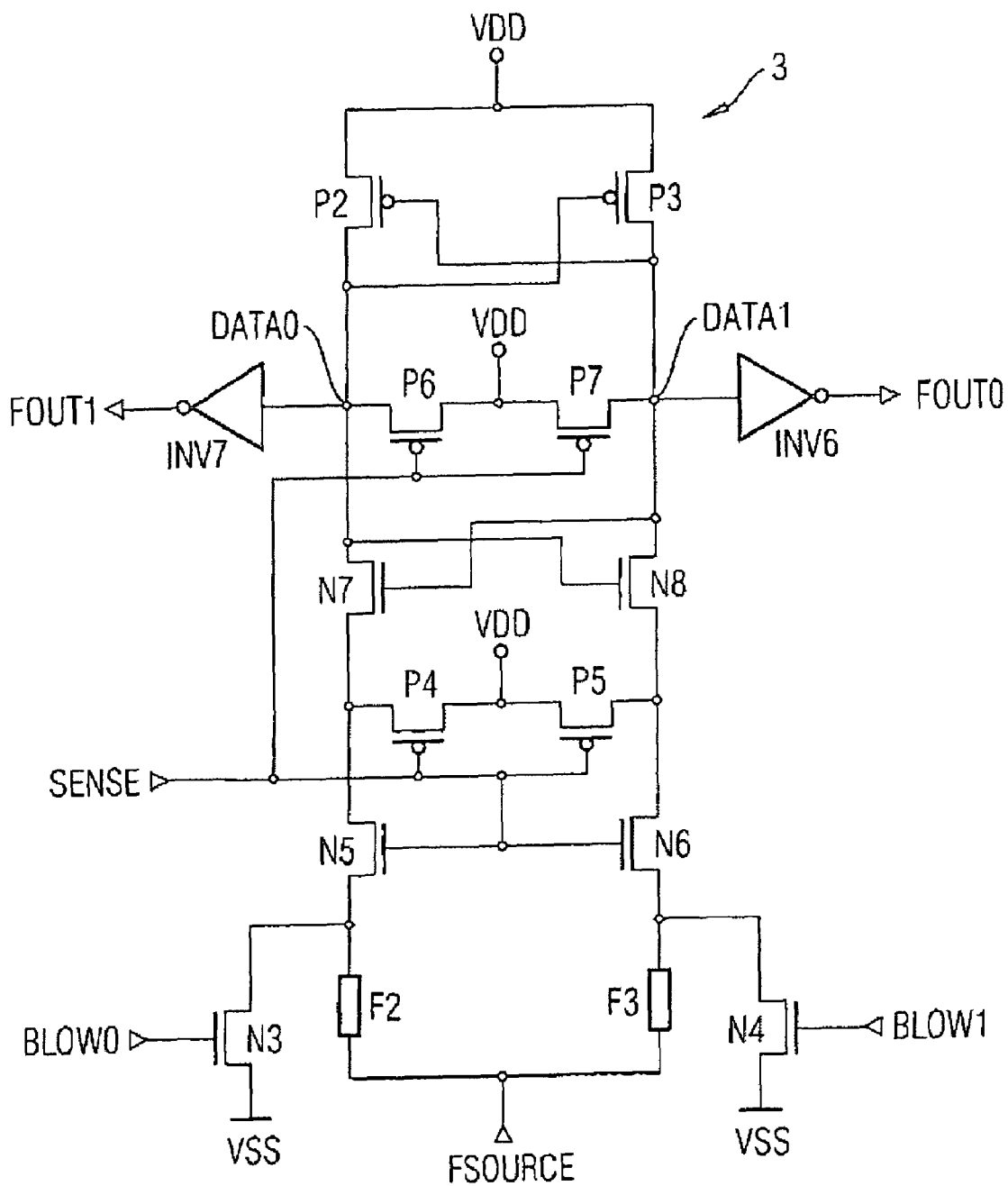
FIG. 4 is another schematic circuit diagram illustrating an exemplary read-out circuit for reading out the programming states of two electrical fuse memory cells according to one or more aspects and/or embodiments of the present invention.

FIG. 4 is schematic circuit diagram illustrating another exemplary read-out circuit according to one or more aspects and/or embodiments of the present invention. The read-out circuit 3 substantially corresponds to the read-out circuit 2 depicted in FIG. 3. In contrast to the read-out circuit 2, however, the internal construction of the inverters INV4 and INV5 is illustrated in the read-out circuit 3.

The inverter INV4 illustrated in FIG. 3 is realized by series-connected transistors N7 and P2 in FIG. 4. The source terminal of the transistor N7 is connected to the drain terminal of the transistor N5. Furthermore, the source terminal of the transistor P2 is connected to the supply voltage potential VDD. The input of the inverter INV4 formed from the transistors N7 and P2 is formed by the two gate terminals of the transistors N7 and P2 which are connected to one another at the node DATA1. The node DATA0 lying between the transistors N7 and P2 represents the output of the inverter INV4. The output of the inverter INV4 feeds the inverter INV7 as in FIG. 3.

The inverter INV5 illustrated in FIG. 3 is realized in a corresponding manner by series-connected transistors N8 and P3 in FIG. 4. The node DATA0 forms the input of the inverter INV5 and the node DATA1 forms the output of the inverter INV5. The output of the inverter INV5 feeds the inverter INV6 as in FIG. 3.

In addition to the components of the read-out circuit 2, the read-out circuit 3 also has four transistors P4 to P7. By means of the transistors P4 to P7, the supply voltage potential VDD can be applied to the nodes DATA0 and DATA1 and also the source terminals of the transistors N7 and N8. The gate terminals of the transistors P4 to P7 are connected to the input SENSE.

The functioning of the read-out circuits 2 and 3 is described below.

An important feature of the read-out circuits 2 and 3 is the different programming of the two fuse memory cells F2 and F3. One of the fuse memory cells F2 and F3 is in the "conducting" programming state, while the other memory cell is in the "non-conducting" programming state. The memory information stored in the memory unit formed from the fuse memory cells F2 and F3 is given by the assignment of the complementary programming states to the fuse memory cells F2 and F3. The memory unit can assume two states in this case. Either the fuse memory cell F2 is conducting and the fuse memory cell F3 is non-conducting, or the fuse memory cell F2 is non-conducting and the fuse memory cell F3 is conducting.

The interruption of the fuse connection of one of the two fuse memory cells F2 and F3 is effected by applying a suitable potential to the input BLOW0 or BLOW1, so that the source-drain path of the respective transistor N3 or N4 is turned on. Furthermore, a high voltage is applied to the input FSOURCE. As a result, this leads to a current flow through the respective fuse memory cell F2 or F3 and to a blowing of the metal-metal connection of the respective fuse memory cell F2 or F3.

Figure 5:
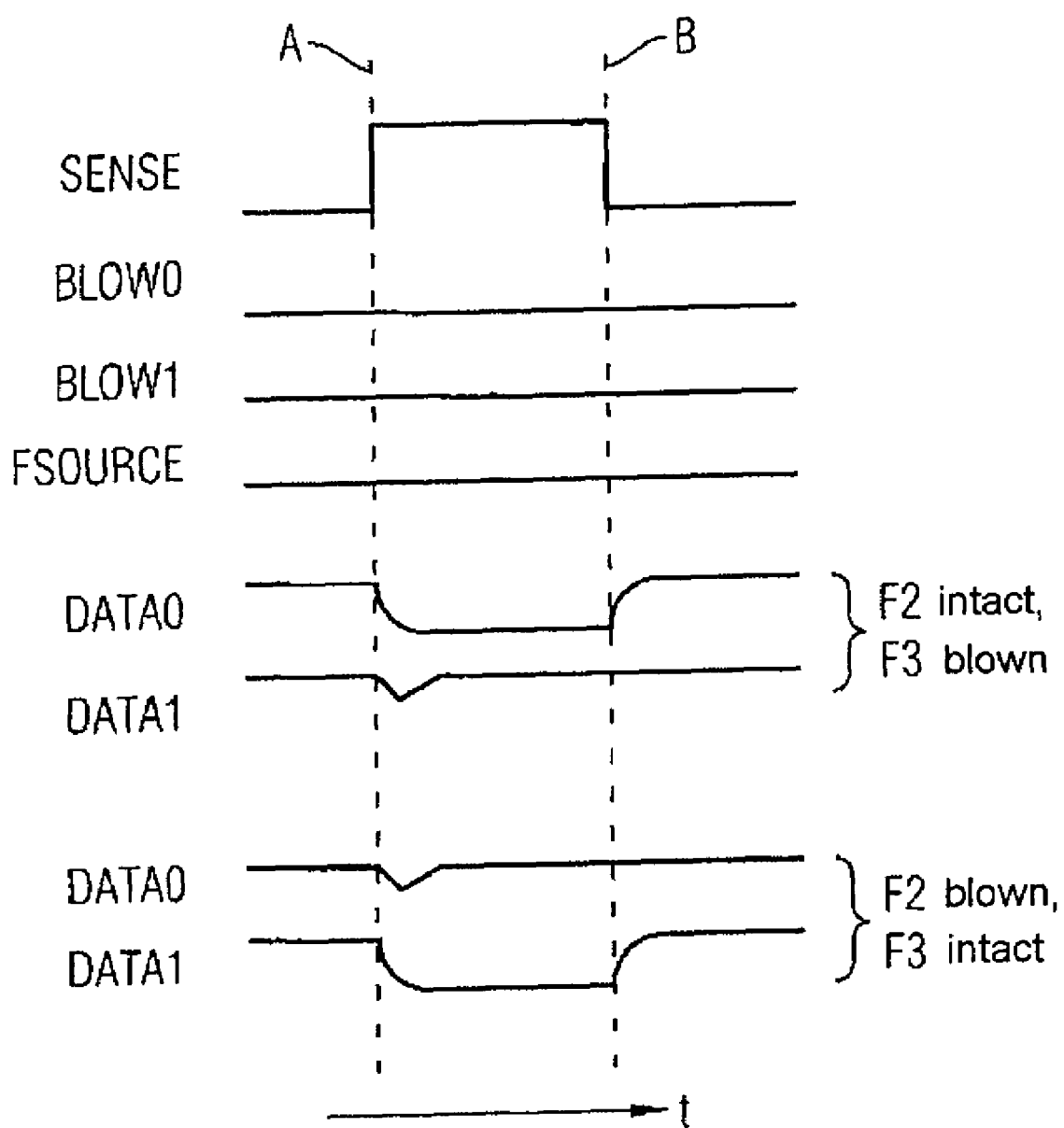
FIG. 5 is a schematic diagram illustrating the functioning of the read-out circuits depicted in FIGS. 3 and 4.

In order to illustrate the operation of reading out the memory information stored in the memory unit formed from the fuse memory cells F2 and F3, FIG. 5 illustrates the temporal profiles of the potentials at different points in the read-out circuit 3 during the read-out operation. Specifically, in the diagrams of FIG. 5, the potentials of the inputs SENSE, BLOW0, BLOW1 and FSOURCE and also the potentials of the nodes DATA0 and DATA1 are plotted against the time t. The potential profiles at the nodes DATA0 and DATA1 are illustrated for two cases, namely where the fuse memory cell F2 is conducting and the fuse memory cell F3 is non-conducting, and where the fuse memory cell F2 is non-conducting and the fuse memory cell F3 is conducting. The beginning of the read-out operation is identified by a dashed line A in FIG. 5 and the end of the read-out operation is identified by a dashed line B.

During the read-out of the programming states of the fuse memory cells F2 and F3, the inputs BLOW0, BLOW1 and FSOURCE are at the potential logic 0. The input SENSE is switched to logic 1 at the beginning of the read-out, so that the read outputs of the fuse memory cells F2 and F3 are electrically connected to the source terminals of the transistors N7 and N8. Logic 0 is otherwise present at the input SENSE.

Furthermore, the source-drain paths of the transistors P4 to P7 are turned off as a result of the changeover of the potential at the input SENSE at the beginning of the read-out method. On account of the arrangement of the transistors P4 to P7, before the changeover of the potential at the input SENSE, the supply voltage potential VDD is present at the nodes DATA0 and DATA1 and also at the source terminals of the transistors N7 and N8. Consequently, the nodes DATA0 and DATA1 and the source terminals of the transistors N7 and N8 are at the supply voltage potential VDD at the beginning of the read-out method. If the fuse memory cell F2 is conducting and the fuse memory cell F3 is non-conducting, a significantly larger current flows—as soon as the source-drain paths of the transistors N5 and N6 are turned on—through the fuse memory cell F2 and through the fuse memory cell F3. As a result, the potential at the source terminal of the transistor N7 drops, while the potential at the source terminal of the transistor N8 remains relatively constant. As a result, a potential difference arises between the source terminals of the transistors N7 and N8. On account of the circuit arrangement of the read-out circuit 3, said potential difference is also generated between the nodes DATA0 and DATA1 and kept constant there. Furthermore, the circuit arrangement of the read-out circuit 3 has the effect that within the transistor pairs P2 and N7, and P3 and N8 that are respectively connected in series, one of the transistors turns off. This ultimately leads to a suppression of static currents.

With opposite programming of the fuse memory cells F2 and F3, the behaviour of the potentials at the nodes DATA0 and DATA1 is reversed—as shown in FIG. 5. During the read-out of the programming state of the fuse memory cells F2 and F3, the potential of one of the outputs FOUT0 and FOUT1 consequently changes significantly depending on the programming. The binary memory information stored in the memory unit formed from the fuse memory cells F2 and F3 can be determined from this.

The discussion of the read-out circuits 2 and 3 has until now been based on a complementary programming state of the fuse memory cells F2 and F3. As an alternative to this, however, it will be appreciated that the fuse memory cell F2 may have a fixed resistance value, that is to say that the fuse memory cell F2 has a reference programming state. In contrast thereto, the fuse memory cell F3 is programmed, two states being available for its programming. In one programming state, the fuse connection of the fuse memory cell F3 remains intact and forms a resistance which is smaller than the resistance of the fuse memory cell F2. In the other programming state, the fuse connection of the fuse memory cell F3 is blown and accordingly has a larger resistance than the fuse memory cell F2. In order to read out the resulting programming state of the memory unit formed from the fuse memory cells F2 and F3, the read-out circuits 2 and 3 can be used in the same way as described above.

Although the invention has been illustrated and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, "exemplary" is merely intended to mean an example, rather than "the best".

The invention claimed is:

1. A read-out circuit for reading out an item of memory information stored in a memory unit, where the memory unit comprises two non-volatile memory cells having different programming states, and where the memory information of the memory unit is given by the programming states of the two memory cells, the read-out circuit comprising:

a volatile signal memory having two inputs and at least one output, the inputs, during the read-out of the memory information of the memory unit, being connected to read outputs of the two memory cells and the memory information of the memory unit being able to be read out at the at least one output;

first selective coupling means between a first input of the signal memory and a read output of a first memory cell, and selectively coupling the first input of the signal memory to the read output of the first memory cell during read-out of the memory information; and second selective coupling means between a second input of the signal memory and a read output of a second memory cell, and selectively coupling the second input of the signal memory to the read output of the second memory cell during read-out of the memory information.

2. The read-out circuit of claim 1, wherein the two non-volatile memory cells have mutually complementary programming states, and the memory information of the memory unit is given by the assignment of the programming states to the two memory cells.

3. The read-out circuit of claim 1, wherein the first memory cell of the two non-volatile memory cells has a fixed reference programming state, the second memory cell of the two non-volatile memory cells has a first programming state and a second programming state and the memory information of the memory unit is given by the choice of the programming state of the second memory cell.

4. The read-out circuit of claim 2, wherein the non-volatile memory cells are 1-bit memory cells.

5. The read-out circuit of claim 1, wherein the non-volatile memory cells are fuse memory cells.

6. The read-out circuit of claim 1, wherein the signal memory is a latch signal memory.

7. The read-out circuit of claim 6, wherein the latch signal memory further comprises:

two inverters, where respective outputs of the inverters are coupled to respective inputs of the other inverters.

8. The read-out circuit of claim 7, wherein the inverters each comprise:

two series-connected transistors, and wherein the respective read outputs of the memory cells, during the read-out of the memory information of the memory unit, are connected to a series circuit formed from the two series-connected transistors of the respective inverters.

9. The read-out circuit of claim 8, wherein each of the two series-connected transistors of the respective inverters comprise an NMOS transistor and a PMOS transistor.

10. The read-out circuit of claim 9, wherein the read outputs of the memory cells, during the read-out of the memory information of the memory unit are coupled to source terminals of respective NMOS transistors of respective inverters.

11. The read-out circuit of claim 9, wherein a potential of a supply voltage is applied to the source terminals of the PMOS transistors.

12. The read-out circuit of claim 11, wherein the supply voltage potential is selectively applied to connecting nodes between the respective two transistors of the respective inverters via at least one first switch.

13. The read-out circuit of claim 12, wherein the at least one first switch is configured to isolate the connecting nodes arranged between the respective two transistors of an inverter from the supply voltage potential during the read-out of the memory information of the memory unit.

14. The read-out circuit of claim 13, wherein the supply voltage potential is selectively applied to the inputs of the signal memory via at least one second switch.

15. The read-out circuit of claim 14, wherein the at least one second switch is configured to isolate the inputs of the signal memory from the supply voltage potential during the read-out of the memory information of the memory unit.

16. The read-out circuit of claim 15, wherein the first and second selective coupling means comprise respective transistors.

17. The read-out circuit of claim 16, wherein the fuse connections of the fuse memory cells can be electrically interrupted for programming.

18. A memory arrangement, comprising:

a memory unit comprising two non-volatile memory cells having different programming states, memory information of the memory unit being given by the programming states of the two memory cells; and a read-out circuit for reading the memory unit, the read-out circuit comprising:

a volatile signal memory having two inputs and at least one output, the inputs, during the read-out of the memory information of the memory unit, being connected to read outputs of the two memory cells and the memory information of the memory unit being able to be read out at the at least one output;

first selective coupling means between a first input of the signal memory and a read output of a first memory cell, and selectively coupling the first input of the signal memory to the read output of the first memory cell during read-out of the memory information; and second selective coupling means between a second input of the signal memory and a read output of a second memory cell, and selectively coupling the second input of the signal memory to the read output of the second memory cell during read-out of the memory information.

\* \* \* \* \*